United States Patent [19]

Seong et al.

[11] Patent Number: 5,944,536
[45] Date of Patent: Aug. 31, 1999

[54] COVER FOR AN EDGE MOUNTED PRINTED CIRCUIT BOARD CONNECTOR

[75] Inventors: Au Yong Chooi Seong; Nai Hock Lwee, both of Singapore, Singapore

[73] Assignee: Thomas & Betts Corporation, Memphis, Tenn.

[21] Appl. No.: 08/741,011

[22] Filed: Oct. 31, 1996

[51] Int. Cl.$^6$ .................................................... H01R 9/09
[52] U.S. Cl. .............................. 439/79; 439/59; 439/328
[58] Field of Search .................................. 439/79, 80, 65, 439/59, 328, 325, 377

[56] References Cited

U.S. PATENT DOCUMENTS

| | | |
|---|---|---|
| Re. 28,509 | 8/1975 | Piechocki et al. . |
| 3,652,899 | 3/1972 | Henschen . |
| 4,157,785 | 6/1979 | Freliech . |
| 4,193,108 | 3/1980 | Romano . |
| 4,416,496 | 11/1983 | Brefka . |
| 4,695,112 | 9/1987 | Maston et al. . |
| 4,708,415 | 11/1987 | White ........................................ 439/59 |
| 4,712,848 | 12/1987 | Edgley . |
| 4,734,042 | 3/1988 | Martens et al. . |
| 4,736,882 | 4/1988 | Winter et al. . |
| 4,741,472 | 5/1988 | Bärmann . |
| 4,796,796 | 1/1989 | Habraken . |
| 4,819,327 | 4/1989 | Tatsuoka et al. . |
| 4,968,266 | 11/1990 | Yamamoto ............................... 439/325 |
| 5,083,696 | 1/1992 | Kan et al. . |
| 5,096,435 | 3/1992 | Noschese et al. . |
| 5,160,275 | 11/1992 | Nakamura et al. ..................... 439/328 |
| 5,176,255 | 1/1993 | Seidler . |
| 5,184,961 | 2/1993 | Ramirez et al. . |
| 5,186,377 | 2/1993 | Rawson et al. . |
| 5,197,652 | 3/1993 | Yamazaki . |
| 5,277,611 | 1/1994 | Berek et al. . |
| 5,307,929 | 5/1994 | Seidler . |
| 5,318,212 | 6/1994 | Becker et al. . |
| 5,419,483 | 5/1995 | Becker et al. . |
| 5,689,405 | 11/1997 | Bethurum ............................... 439/328 |
| 5,823,799 | 10/1998 | Tor et al. ................................... 439/79 |

FOREIGN PATENT DOCUMENTS

| | | |
|---|---|---|
| 0024141 | 2/1996 | Singapore . |
| 0038965 | 4/1996 | Singapore . |
| 0032393 | 8/1996 | Singapore . |
| 0032459 | 8/1996 | Singapore . |
| 0032488 | 8/1996 | Singapore . |
| 0032505 | 8/1996 | Singapore . |
| 0033475 | 10/1996 | Singapore . |
| 0033508 | 10/1996 | Singapore . |
| 0033618 | 10/1996 | Singapore . |

*Primary Examiner*—Paula Bradley
*Assistant Examiner*—Tho D. Ta
*Attorney, Agent, or Firm*—Hoffmann & Baron, LLP

[57] ABSTRACT

A cover is employed with an edge mount electrical header connector to secure the header connector to a printed circuit board during soldering. The header connector includes plural electrical contacts supported in an insulative housing. The contacts include extending solder tails for engagement with solder pads of the printed circuit board. The cover includes an elongate insulative body for attachment to the header connector. The body of the cover includes gripper arms extending therefrom and being in spaced opposition to the extending solder tails. The solder tails and the gripper arms form a space therebetween for receiving an edge of the printed circuit board. The gripper arms and solder tails retain the printed circuit board edge so as to permit secure soldering of the solder tails to the solder pads of the printed circuit board.

11 Claims, 3 Drawing Sheets

COVER FOR AN EDGE MOUNTED PRINTED CIRCUIT BOARD CONNECTOR

FIELD OF THE INVENTION

The present invention relates generally to an electrical connector assembly for mounting to a printed circuit board. More particularly, the present invention relates to a removable cover for a surface mount printed circuit board connector which permits the secure positioning of the connector to the edge of the printed circuit board so as to permit solder connection of the connector to the printed circuit board.

BACKGROUND OF THE INVENTION

There are a wide variety of electrical connectors which are adapted to be mated with a printed circuit board. Many of these connectors, referred to as header connectors, are supported adjacent an edge of the printed circuit board so as to be accessible for external electrical connection with a mating connector.

These header connectors typically include an insulative housing which supports a plurality of electrical contacts therein. The contacts include tail portions which extend from the housing and are adapted for electrical engagement with electrical traces on the printed circuit board. The solder tails extending from the housing of the header connector are aligned with solder pads of the traces of the printed circuit board so that the solder tails may be ultimately soldered to the solder pads effecting permanent mechanical and electrical engagement between the header connector and the printed circuit board. The solder tails are typically spring biased so as to exert a spring force against the solder pads of the printed circuit board so that effective electrical engagement is established and maintained upon placement of the header connector on the edge of the printed circuit board.

As these header connectors are mounted to an edge of the printed circuit board, the connectors may be subject to tilting or movement during the manufacturing process prior to solder connection of the tails to the pads. Tilting or movement of the connector with respect to the printed circuit board may cause a dislodgement of one or more of the solder tails from the solder pad. Furthermore, warpage of the printed circuit board is often found. Such warpage may result in intermittent contact between the solder pads. Additionally, as the solder tails are typically spring biased to assure engagement with the solder pads, excessive titling, warping or movement may result in loss of resiliency of the spring biased tails.

One technique to overcome such problems is to rigidly clamp the header connector to the printed circuit board prior to soldering so as to prevent movement of the connector with respect to the board. Clamping of the connector to the board often requires use of fastening hardware such as screws which are mounted through the connector and into holes located in the printed circuit board. Use of such securement hardware may interfere with the soldering process rendering such soldering difficult and costly. Furthermore, rigidly clamping the connector to the printed circuit board also results in other problems. For instance, mechanical fastening in this manner may also result in the spring bias of the solder tails losing their resiliency and thereby losing effective electrical engagement with the solder pads of the traces.

In order to alleviate certain of these problems it has been found that an edge mounted header connector may be formed with one or more gripper arms which extend from the insulative housing and underlie the solder tails at one or more locations along the length of the header connector. The gripper arms and the solder tails form a space therebetween which accommodates the edge of the printed circuit board. To a great extent the location of the gripper arms prevents the adverse effects of connector tilting with respect to the printed circuit. Thus the solder tails are maintained in contact with the solder pads during and after the soldering process. A connector having such gripper arms and exhibiting such advantages is shown and described in commonly assigned U.S. patent application entitled "SINGLE-SIDED STRADDLE MOUNT PRINTED CIRCUIT BOARD CONNECTOR", filed Oct. 23, 1996, bearing attorney docket number 577–155. While the structure shown and described in that application serves adequately for its intended function, the connector itself must be formed to have such gripper arms. This requires forming a specialized connector having the gripper arm feature formed therewith. In certain situations where a header connector is to be employed where the gripper arms do not pre-exist in the connector structure, the features and benefits of such gripper arms cannot be employed. Also as this gripper arm feature is integral with the connector it remains with the connector after soldering. This may not always be a desirable situation.

It is therefore desirable to provide an electrical connection assembly which may be mounted to the edge of the printed circuit board and which provides superior resistance to the adverse affects of connector tilting with respect to the printed circuit board.

SUMMARY OF THE INVENTION

It is an object of the present invention to provide an electrical connection assembly which permits the secure mounting of a connector to the edge of a printed circuit board.

It is a further object of the present invention to provide an electrical connection assembly which may be mounted to the edge of a printed circuit board and which overcomes the adverse effects of connector tilting with respect to the printed circuit board.

It is a still further object of the present invention to provide an edge mounted header connector which employs a cover which may be supported on the connector to secure the header connector to the edge of a printed circuit board so as to secure the connector to the board during soldering.

In the efficient attainment of these and other objects, the present invention provides a cover for supporting a header connector to a printed circuit board. The header connector includes plural electrical contacts supported in an insulative housing. The contacts include solder tail portions extending from the housing for engagement with solder pads on the edge of the printed circuit board. The cover includes an elongate insulative body for attachment to the header connector. The insulative body of the cover further includes a gripper arm extending therefrom and being in spaced opposition to the extending solder tails of the header connector. The solder tails and the gripper arm form a space therebetween for receiving the edge of the printed circuit board. The connector assembly formed by the header connector and the cover is secured to the edge of the printed circuit board and results in the solder tails being maintained in mechanical and electrical engagement with the solder pads on the edge of the printed circuit board for proper positioning during the soldering process.

As shown by way of the preferred embodiment herein, an electrical interconnection assembly includes the printed circuit board having opposed planar surfaces and plural solder pads being aligned along one surface edge of the printed circuit board. The edge mounted header connector supports plural contacts having the solder tails extending outwardly from the housing so as to make spring bias engagement with the solder pads of the printed circuit board. The cover may be positionable over the header connector so as to position the extending gripper arm in engagement with the surface of the printed circuit board opposite the solder pads. The gripper arm being in spaced opposition to the solder tails forms a space which supports the edge of the printed circuit board therebetween and maintains the solder tails in spring contact with the solder pads of the printed circuit board. The cover maintains such connection between the solder tails of the connector and solder pads during the soldering process.

DETAILED DESCRIPTION OF THE PREFERRED EMBODIMENT

Figure 1:
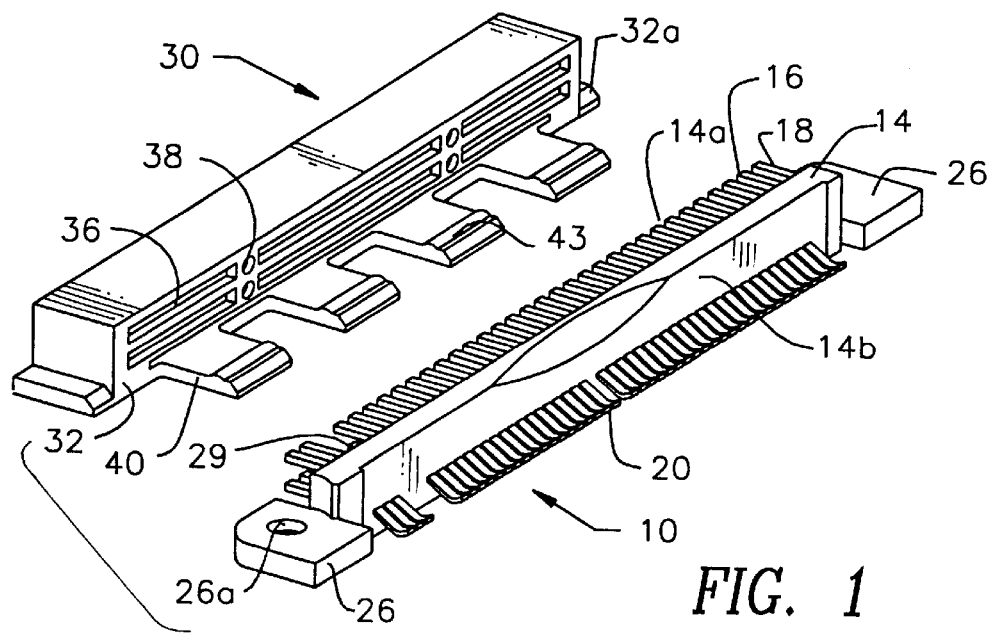
FIG. 1 is an exploded perspective view of an edge mount electrical header connector and a cover of the present invention which is used to support the header connector to a printed circuit board.
Figure 2:
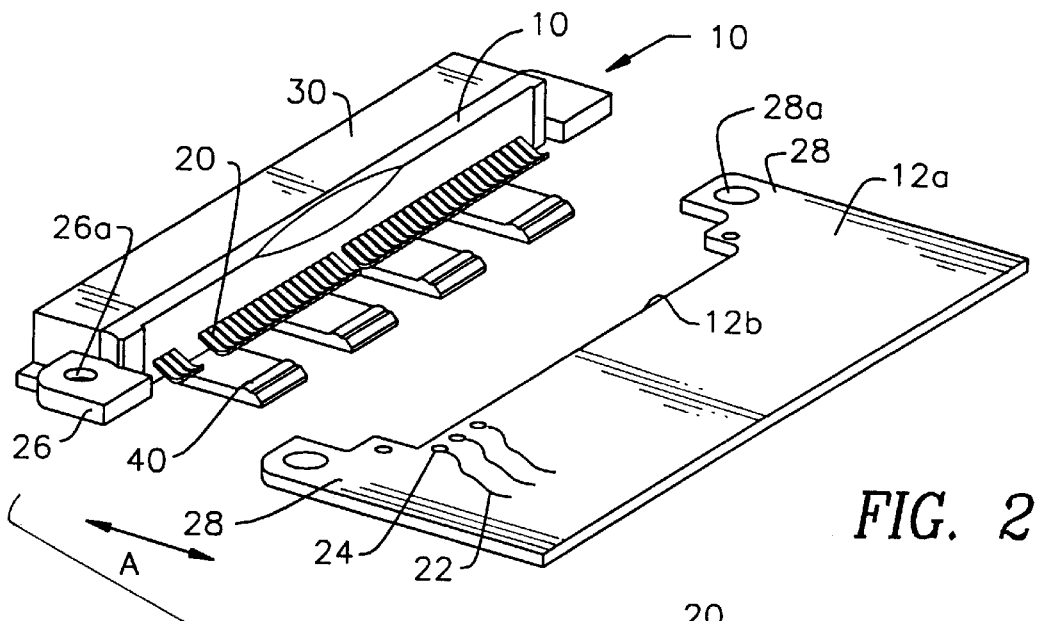
FIG. 2 is a perspective view of an assembly of the header connector and cover attachable to a printed circuit board.
Figure 3:
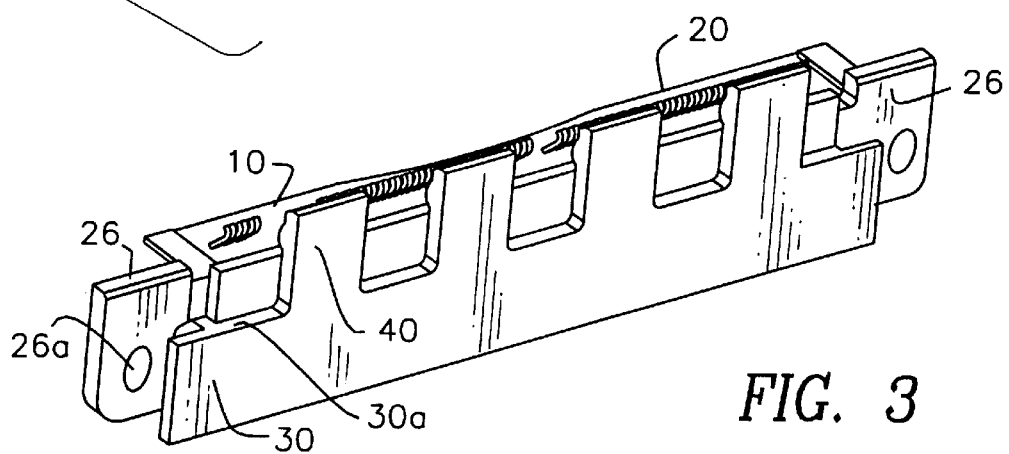
FIG. 3 is a bottom perspective view of the header connector assembled to the cover.

Referring to the drawings, the present invention permits the secure electrical interconnection of an edge mount header connector 10, shown particularly in FIG. 1, to a printed circuit board 12 shown in FIG. 2.

Edge mount header connector 10 is of generally known construction including an elongate housing 14 formed of suitably insulative material such as a glass filled polyphenylene sulfide (PPS) or polyphthalamide (PPA). Housing 14 supports a plurality of electrical contacts 16 therein. Contacts 16 are also of conventional construction being formed of a suitably conductive metal. Contacts 16 include opposed ends which permit interconnection of header connecter 10. Each contact 16 includes a first end in the form of a male contact pin 18 which extends externally from one longitudinal surface 14a of housing 14 for external electrical connection with mating contacts of a mating connector as will be described in further detail hereinbelow. While a male pin is shown by way of example, any configuration of contact may be employed. Each contact 16 also includes an opposed end in the form of a solder tail 20 which extends externally from an opposite longitudinal surface 14b of housing 14. Contacts 16, including the associated pins 18 and solder tails 20, may be arranged in housing 14 in any desirable pattern. In the present embodiment, the pins 18 are arranged in two longitudinally extending rows, while the solder tails are arranged in a single longitudinally extending row.

Housing 14 is designed for mechanical and electrical connection with printed circuit board 12. Printed circuit board 12 is of conventional construction including a planar member having first surface 12a which has disposed thereon a pattern of electrically conductive traces 22 which terminate in solder pads 24. The solder pads 24 are typically aligned along a mating longitudinal edge 12b of printed circuit board 12 so that electrical connection may be established between edge mounted header connector 10 and printed circuit board 12.

As shown in FIGS. 1 and 2, the solder tails 20 of contact 16 are of the spring retention type being designed for deflectable frictional electrical engagement with the solder pads 24 of printed circuit board 12. Upon placement of the header connector 10 onto the edge 12b of printed circuit board 12, the solder tails 20 are designed and shaped to be biased against solder pads 24. The spring bias of the solder tails 20 assures that electrical connection is established between of the solder tails an the associated solder pads 24.

Once properly positioned with the solder tails 20 in contact with the solder pads 24, in conventional practice, the header connector would be mechanically mounted to the printed circuit board to fix its position with respect to the printed circuit board. In that regard, housing 14 includes a pair of extending ears 26 which extend from each longitudinal end thereof. Each ear 26 includes a mounting aperture 26a therethrough. Printed circuit board 12 includes complimentary ears 28 and associated apertures 28a therethrough. The ears 26 of housing 14 are designed for alignment with the ears 28 of printed circuit board 12 so that the apertures 26a and 28a are aligned. Conventionally, fastening hardware such as a screw and bolt (not shown) may be used to fix the header connector 10 to the printed circuit board 12 adjacent edge 12b. Positioned in this manner, the spring contact solder tails 20 are urged against the solder pads 24 effecting mechanical and electrical engagement therebetween. At this stage in the conventional assembly, the solder tails 20 of contact 16 are individually soldered to the solder pads 24 effecting permanent electrical engagement therebetween. Conventional soldering techniques such as IR, reflow or wave soldering may be employed.

While the direct mechanical mounting of header connector 10 to printed board 12 is designed to place the spring biased solder tails in secure electrical engagement with solder pads 24, certain problems which arise in manufacturing and handling may result in intermittent or ineffective contact between certain of the solder tail/solder pad connections. During handling and manufacturing the printed circuit board and the connector may be subject to relative tilting or movement. Such movement may cause dislodgment of one or more of the solder tails from the solder pads. Further, the printed circuit board by its planar nature is subject to warpage. Board warpage makes connection to the header connector difficult. Warpage may also result in an ineffective contact between one or more of the solder tails and the solder pads. Such movement or warpage may compromise the mechanical and electrical engagement of the header connector with the printed circuit board. Furthermore, board warpage or connector tilting may also result in the loss of resiliency of the spring biased solder tails again resulting in potential intermittent contact. Any gaps or intermittent contact between the solder tails and the solder pads may result in an ineffective solder joint being achieved during the soldering process.

Figure 2A:
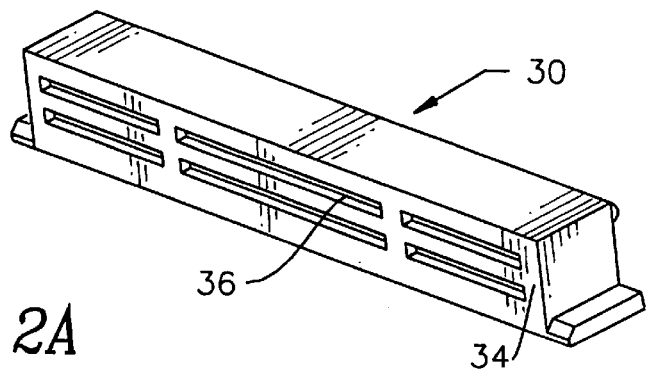
FIGS. 2A and 2B show rear and front perspective s views, respectively, the cover of the present invention.
Figure 2B:
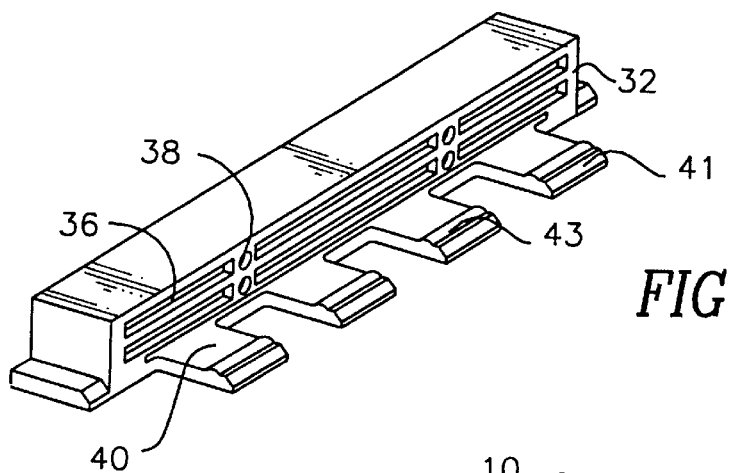

In order to more effectively attach the header connector to the printed circuit board and to assure that the solder tails of the header remain in secure electrical engagement with the solder pads of the printed circuit board during the soldering process, the present invention employs a connector cover 30 shown in detail in FIGS. 1, 2A and 2B.

Cover 30 includes an elongate generally rectangular body which is formed of suitably electrically insulative material which is resistant to the effects of high temperature soldering. Cover 30 includes a first face 32 shown in detail in FIG. 2B and an opposed second face 34 shown in detail in FIG. 2A. Cover 30 includes a plurality of elongate generally rectangular openings 36 extending between first face 32 and second face 34. Openings 36 are designed for alignment with extending male pins 18 of header connector 10. Cover 30 also includes one or more generally circular apertures 38 arranged at various locations on first face 32. Apertures 38 are provided to engage in a frictional manner mounting projections 29 extending from, surface 14a of housing 14 to frictionally support cover 30 to header connector 10.

Cover 30 further includes a plurality of gripper arms 40 extending outwardly from a lower edge 32a of first face 32. Each gripper arm is an elongate member extending in cantilevered fashion from edge 32a of first face 32. Each gripper arm includes a beveled distal extent 41 to facilitate engagement with printed circuit board 12 as will be described hereinbelow. Proximate of distal extent 41, each gripper arm 40 includes an upwardly directed bump 43 for providing an area of concentrated engagement with printed circuit board 12 as will also be described hereinbelow. In the present embodiment, four longitudinally spaced gripper arms are shown extending from first face 32. However, fewer or more gripper arms may be employed.

Figure 5:
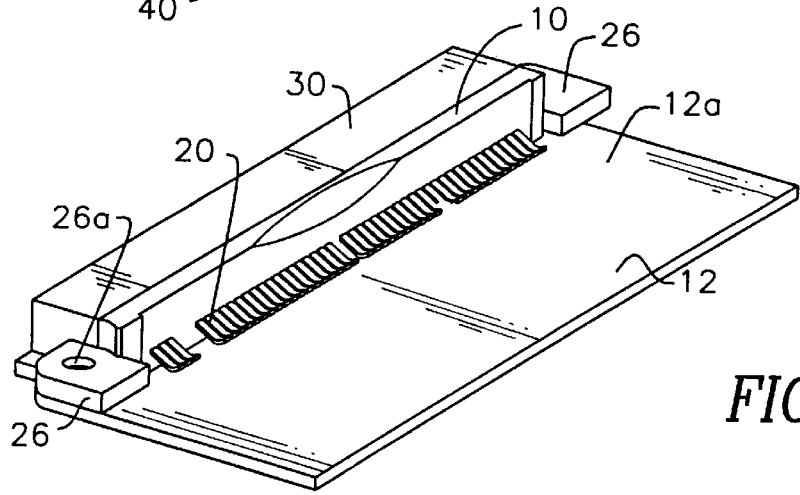
FIG. 5 is a front perspective view of the assembled header connector and cover attached to a printed circuit board.
Figure 4:
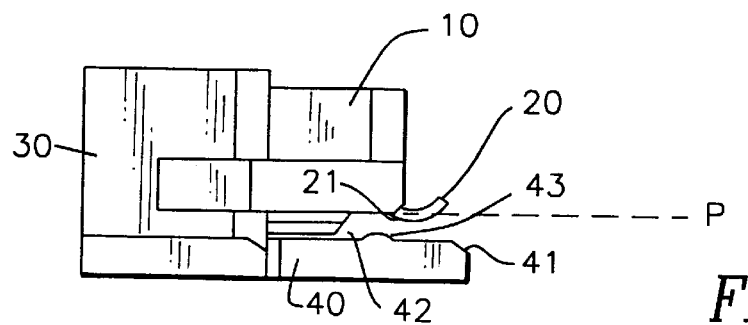
FIG. 4 is a side plan view of the header connector assembled to the cover.

With additional reference to FIGS. 4 and 5, cover 30 is designed to be secured to header connector 10 in a frictional fit manner. The cover 30 is placed over pins 18 of header connector 10. The first face 32 is positioned against surface 14a of connector 10 so that the pins 18 extend into rectangular openings 36. Frictional engagement is achieved between extending projections 29 of housing 14 and apertures 38 on first face 32 of housing 30 to support the cover 30 on connector 10.

The positioning of gripper arms 40 of cover 30 with respect to connector 10 defines a longitudinal space 42 between gripper arms 40 and solder tails 20 of header connector 10. This space is designed for frictional receipt of the edge 12b (FIG. 2) of printed circuit board 12. In use as shown in FIG. 2, the assembled cover 30 and connector 10, are moved towards printed circuit board 12 in the direction of arrow A. The edge 12b of printed circuit board is moved into the space 42 (FIG. 4) defined between solder tails 20 and gripper arms 40. Such movement is facilitated by the beveled distal extent 41 of gripper arm 40. Movement in this manner effects mechanical engagement between header connector 10 and printed circuit 12 and electrical engagement between solder tails 20 and solder pads 24. The cover 30 of the present invention is designed in combination with header connector 10 to accommodate a specified printed circuit board thickness. Thus, the printed circuit board is frictionally fitted between gripper arm 40 and solder tail 20. Gripper arms 40 extend a sufficient length along a lower surface of printed circuit board 12 to effectively support header connector thereon.

The effective connection of printed circuit board 12 to header connector 10 by employing cover 30 is now shown and described.

Each solder tail 20 generally includes a curved contact surface 21 (FIG. 4) which extends below printed circuit board seating plane P within the space 42 defined between gripper arms 40 and solder tails 20. In this fashion, the curved surfaces 21 of the solder tails 20 are positively preloaded onto the solder pads 24 (FIG. 2) of printed circuit board 12 providing superior electrical engagement therewith. The curved surfaces 21 of solder tails 20 are positioned in spaced facing opposition to the bumps 43 of gripper arm 40. The space defined between bumps 43 and curved surfaces 21 is less than the thickness of the printed circuit board to assure contact pre-loading. Use of spring biased solder tails allows control of the coplanarity of the solder tails to be relaxed without sacrificing the ability to make good electrical contact with the solder pads of the printed circuit board. As mentioned above, it is common that printed circuit boards exhibit warpage due to shrinkage or other post-manufacturing conditions. Due to this warpage, it may become difficult to maintain good electrical contact between all of the solder pads of the printed circuit board and each of the individual solder tails of the connector. In the present invention, by employing cover 30 having a plurality of gripper arms 40 which works in conjunction with header connector 10, the problems of board warpage as well as other problems of movement of the connector with respect to the board prior to soldering can be effectively overcome.

Having described the components of the present invention, use of the present invention may be described with reference to the drawings.

Referring to FIG. 1, cover 30 is attached to header connector 10 with the first face 32 of cover 30 being positioned against surface 14a of housing 14. Frictional engagement secures cover 30 to connector 10 by the frictional interfitting of projections 29 of header connector 10 with apertures 38 of cover 30. The assembled cover and header combination as shown in FIG. 2 may be brought into engagement with printed circuit board 12 by movement of printed circuit 12 towards the connector/cover combination in the direction of arrow A. Upon insertion of board 12 into space 42 along seating plane P as shown in FIG. 4, spring biased electrical engagement is established between curved surfaces 21 of solder tails 20 and solder pads 24 of board 12 (FIG. 2). The relative dimensions of the printed circuit board 12 and the space between the solder tails 20 and gripper arms 40 results in spring defection of the solder tails 20 so as to achieve resilient engagement between the curved surfaces 21 of the solder tails 20 and the solder pads 24 of printed circuit board 12. The gripper arms 40 maintain the solder pads 24 in engagement with the spring biased solder tails 20 correcting for any board warpage and also preventing disconnection of any of the individual solder tails from the solder pads during movement of the components during further manufacturing procedures.

Figure 6:
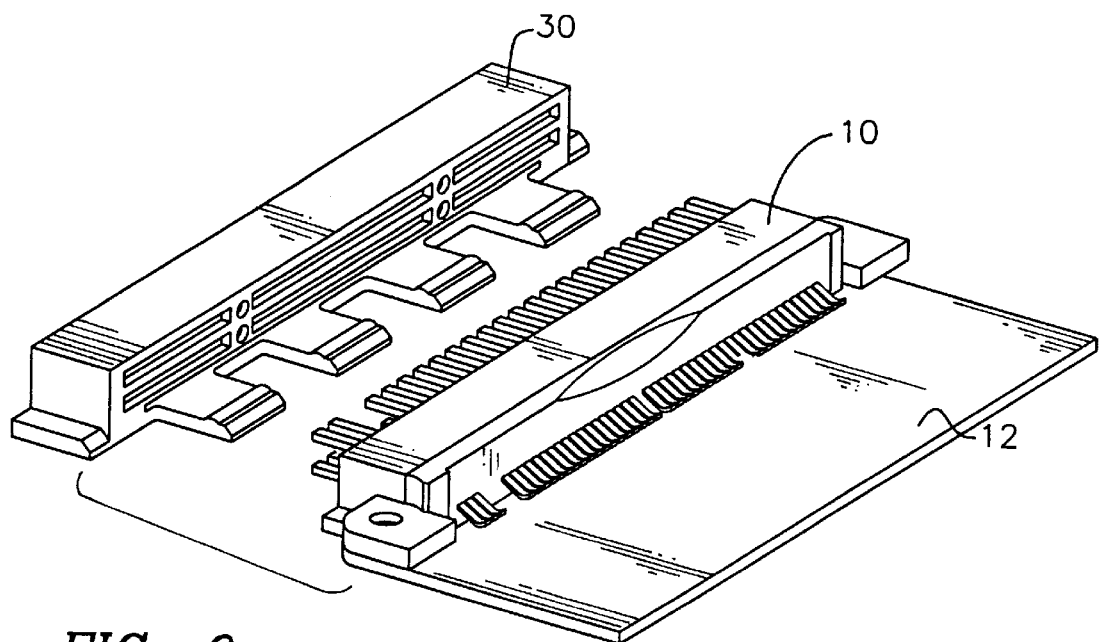
FIG. 6 shows the removal of the cover from the header connector after soldering of the header connector to the printed circuit board.
Figure 7:
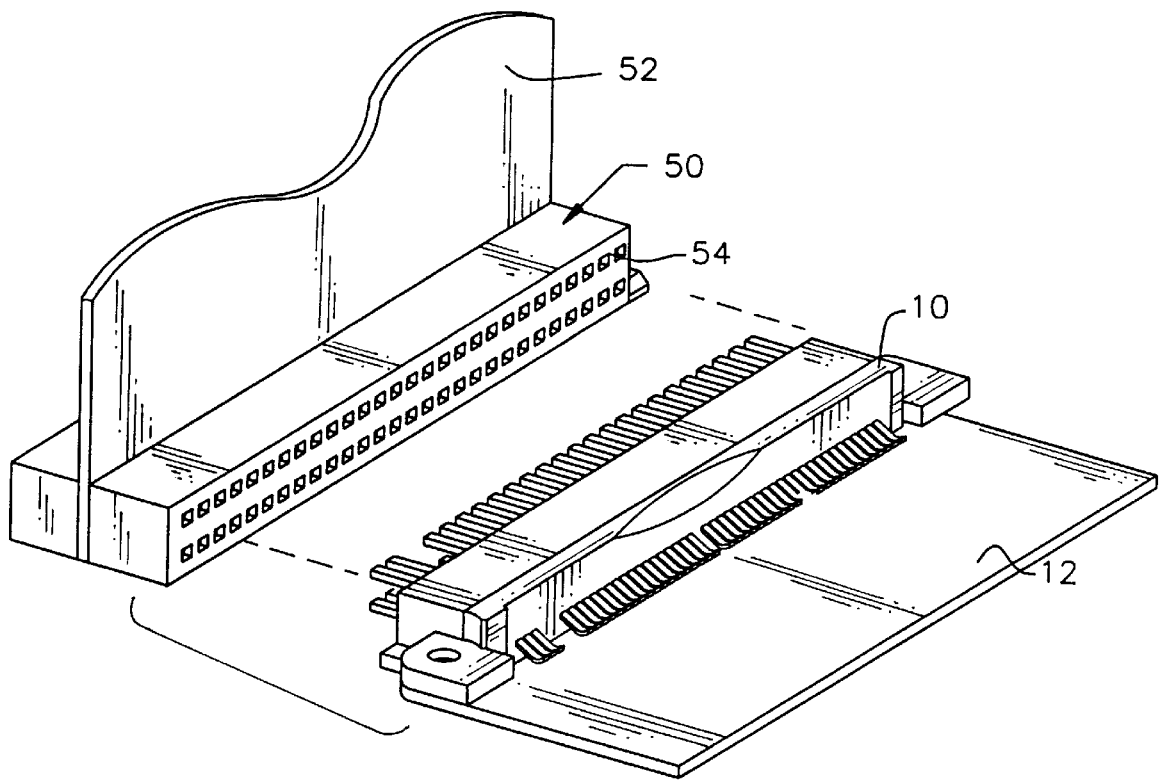
FIG. 7 shows the mating of an electrical cable connector to the header connector soldered to the printed circuit board.

In the position shown in FIG. 5, the solder tails of header connector 10 may be soldered to the solder pads in a conventional fashion. It is noted that during the soldering process, the cover 30 is used to secure header connector 10 to the printed circuit board 12. At this stage, no external securement hardware is necessary. Such securement hardware may render certain soldering techniques more difficult to practice. Once the solder tails 20 are effectively soldered to solder pads 24, cover 30 may be removed from the connector/board assembly in a manner shown in FIG. 6. The cover 30 is then discarded. Permanent attachment of header connector 10 to printed circuit board 12 may now be made by use of appropriate securement hardware (not shown). Such securement hardware may be positioned through apertures 26a, 28a of ears 26,28 of the header connector 10 and board 12 respectively.

The header connector 10 mounted to printed circuit board 12 is now available for mating electrical connection. While any type of mating connector may be mated to header 10, the present invention in the preferred embodiment shows a ribbon connector 50 terminating a multiconductor ribbon cable 52. The male pins 18 of header connector 10 are accessible for interconnection with appropriately constructed socket contacts 54 of ribbon connector 50.

Various changes and modifications can be made to the invention, and it is intended to include all such changes and modifications as come within the scope of the invention as is set forth in the following claims.

What is claimed is:

1. A connector assembly for engagement with an edge of a printed circuit board, said edge having solder pads on one surface thereof, said connector assembly comprising:

a header connector including an elongate insulative housing supporting plural electrical contacts, said contacts having first portions for mating electrical connection with a mating connector and second portions extending from said housing forming solder tails for electrical engagement with said solder pads of said printed circuit board;

an elongate header cover including a body for securement to said header connector; and a gripper arm extending from said body in spaced opposition to said second portions, said second portions and said gripper arm defining a space therebetween for supporting said edge of said printed circuit board with said gripper arm being engageable with a surface of said printed circuit board opposite said one surface.

2. A connector of claim 1 wherein said cover includes plural said gripper arms extending in spaced succession along said body.

3. A connector assembly of claim 1 wherein said gripper arm extends in cantilevered fashion from said body.

4. A connector of claim 3 wherein said second portion of said header connector contacts includes solder tails having curved surfaces for engagement with said solder pads.

5. A connector of claim 4 wherein said gripper arm includes an extending bump, said bump being generally in facing opposition to said curved surfaces of said solder tails.

6. An electrical interconnection assembly comprising:

a printed circuit board having opposed planar surfaces and including plural solder pads on one surface thereof adjacent one edge of said board;

an edge-mounted header connector, said connector including an elongate insulative housing supporting plural electrical contacts, each said contact including a connection portion positioned for exterior electrical connection to contact of a mating connector and solder tails extending from said housing for solder connection to said solder pads of said printed circuit board; and a removable cover having a body positioned over said header connector and including at least one gripper arm extending from said body in spaced opposition to said extending solder tails, said printed circuit board being captively retained within said space between said solder tails and said gripper arm.

7. An assembly of claim 6 wherein said cover includes plural said gripper arms spaced in longitudinal succession along said body.

8. An assembly of claim 7 wherein said gripper arms extend in cantilevered fashion from said body.

9. An assembly of claim 8 wherein said solder tails are resiliently biased and include curved solder pad engagement surfaces.

10. An assembly of claim 9 wherein said gripper arms include bumps adjacent a distal end thereof extending towards said solder tail curved surfaces.

11. An assembly of claim 10 wherein said distance between said curved surfaces of said solder tails and said bumps of said gripper arms is less than the thickness of the printed circuit board.

* * * * *